United States Patent [19]

Kusakabe

[11] 4,172,238

[45] Oct. 23, 1979

[54] DIFFERENTIAL AMPLIFIERS

[75] Inventor: Hiromi Kusakabe, Yokohama, Japan

[73] Assignee: Tokyo Shibaura Electric Co., Ltd., Kawasaki, Japan

[21] Appl. No.: 904,808

[22] Filed: May 11, 1978

[30] Foreign Application Priority Data

May 19, 1977 [JP] Japan .............................. 52/58082

[51] Int. Cl.² .............................................. H03F 3/45
[52] U.S. Cl. ................................... 330/259; 330/252; 330/253
[58] Field of Search ................. 330/69, 252, 253, 259, 330/260, 307

[56] References Cited

U.S. PATENT DOCUMENTS 4,006,400  2/1977  Fett et al. ........................ 330/259 X Primary Examiner—James B. Mullins Attorney, Agent, or Firm—Cushman, Darby & Cushman

[57] ABSTRACT

A plurality of differential amplifier units are cascade connected into a plurality of stages. Odd numbered units except the last unit are double end units whereas even numbered units are single end units. Each unit comprises first and second transistors. The control electrode of at least one transistor of a succeeding unit is supplied with the output of a preceding unit. An input is applied to the control electrode of the first transistor of the first unit, through an external input terminal, and the control electrode of the second transistor of the first unit is grounded in the sense of alternating current through an external grounding terminal. The input terminal and the grounding terminal are interconnected through an impedance. The output of the last unit is fed back to the control electrodes of the second transistors of the odd numbered units.

6 Claims, 6 Drawing Figures

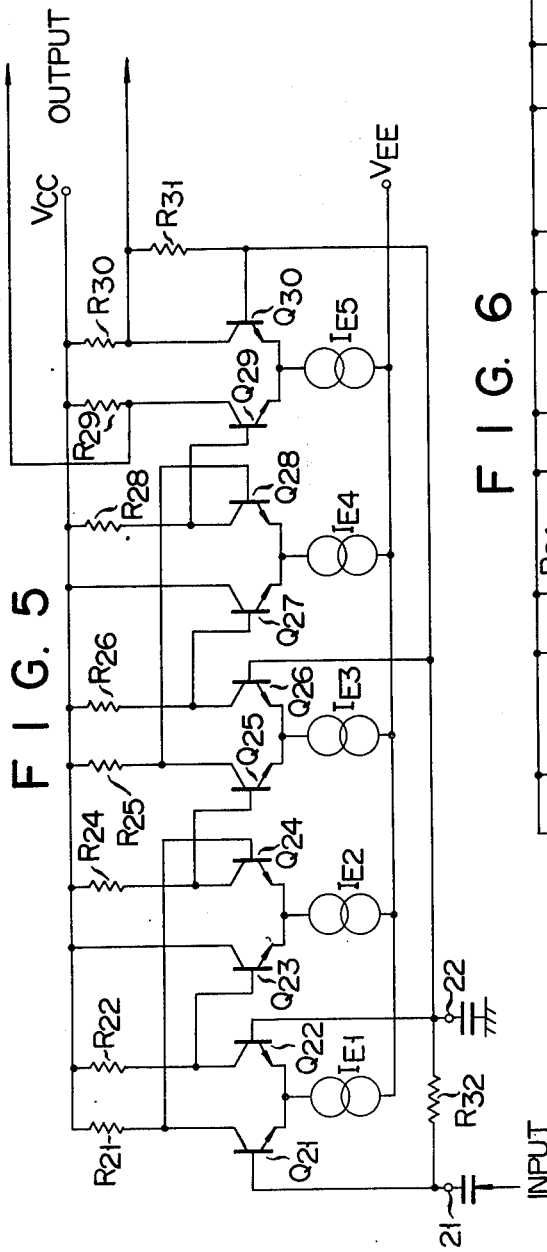
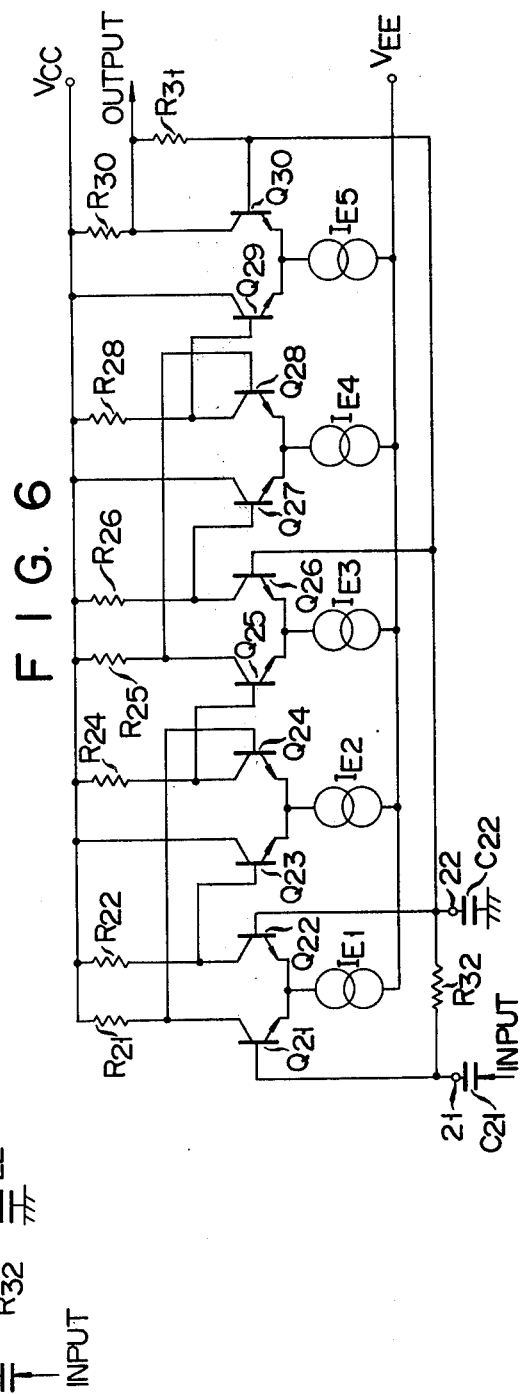
FIG. 5
FIG. 6

DIFFERENTIAL AMPLIFIERS

This invention relates to a differential amplifier suitable to construct an intermediate amplifier circuit of a radio receiver as an integrated circuit.

It is a recent tendency to construct an intermediate amplifier circuit of a radio receiver as an integrated circuit, and a differential amplifier is generally incorporated into the integrated circuit. In this case, it is extremely important to decrease as far as possible the number of the terminals of the different amplifier for external connection and to decrease as far as possible the noise entering into the differential amplifier. Decrease in the number of external connection terminals enables the use of a small size package and decreases the cost of manufacturing, whereas decrease in the noise stabilizes the operation of the differential amplifier. The noise comes from source lines or grounding lines. To have better understanding of the invention typical prior art differential amplifiers will firstly be described with reference to FIGS. 1 and 2 of the accompanying drawings. The differential amplifier shown in FIG. 1 comprises four differential amplifier units each having two outputs (or double end unit) and connected in cascade wherein the differential amplifier units of respective stages comprises transistors $Q_1$ and $Q_2$, $Q_3$ and $Q_4$, $Q_5$ and $Q_6$, and $Q_7$ and $Q_8$ respectively. The collector electrode of each transistor is connected to a line of first source $V_{CC}$ through a resistor and the emitter electrodes of respective transistor are commonly connected to a line of second source $V_{EE}$ through respective constant current elements each having the form of a resistor or a transistor. The base electrode of transistor $Q_1$ is supplied with an input signal via a capacitor and an external terminal 1 whereas the base electrode of transistor $Q_2$ is grounded (in the sense of alternating current) through a capacitor, and an external grounding terminal 2. The output of transistor $Q_7$ is fed back to the base electrode of transistor $Q_1$ via a resistor which is grounded (in the sense of alternating current) via a capacitor and an external terminal 3. The output of transistor $Q_8$ is fed back to the base electrode of transistor $Q_2$. The differential amplifier shown in FIG. 1 is advantageous in that its gain is large and that the noise introduced with the amplifier through source lines connected to the sources $V_{CC}$ and $V_{EE}$ is relatively small. However, it is necessary to have three terminals 1, 2 and 3 for external connection in addition to two source terminals.

In another prior art differential amplifier shown in FIG. 2 pairs of transistor $Q_{11}$ and $Q_{12}$, $Q_{13}$ and $Q_{14}$, $Q_{15}$ and $Q_{16}$, $Q_{17}$ and $Q_{18}$ respectively constitute differential amplifier units each having one output or being single end type. The base electrodes of transistors $Q_{12}$, $Q_{14}$, $Q_{16}$ and $Q_{18}$ are commonly connected to receive a feedback of the output of transistor $Q_{18}$. The emitter electrodes of each transistor pair are commonly connected to the line of second source $V_{EE}$ through respective resistors acting as constant current elements. The base electrode of transistor $Q_{11}$ is supplied with an input signal through a capacitor and an external terminal 11, whereas the base electrode of transistor $Q_{12}$ is grounded (in the sense of alternating current) through a capacitor $C_{11}$ and an external terminal 12. The arrangement shown in FIG. 2 is more advantageous than that shown in FIG. 1 in that the number of the terminals for external connection is lesser by one. However, since each amplifier unit is of the single end type, the voltage gain per unit is about ½ ($-6$ dB) of that of the amplifier unit shown in FIG. 1, if the operation current is the same. Accordingly, to have the same gain as the amplifier shown in FIG. 1 it is necessary to double the number of amplifier units or to make the operation current thereof twice that of FIG. 1 device. With the current construction shown in FIG. 2, one of the input reference ground points of the second stage is the source $V_{CC}$ (that is, the reference point of the collector resistance of the transistor $Q_{12}$), whereas the other reference ground point is the external ground point (the grounding point of a capacitor $C_{11}$ connected to the terminal 12) of an integrated circuit incorporated with this amplifier circuit so that it is impossible to prevent the noise occuring on the source lines in the integrated circuit from entering into the differential amplifier. Especially, when an intermediate frequency amplifier for use in amplitude modulatiorn (AM) is fabricated as an integrated circuit, and when the differential amplifier and a local oscillator are formed on the same chip, the output of the local oscillator readily enters into the differential amplifier thereby decreasing the receiving sensitivity or causing swing of the pointer of a tuning meter even in the absense of a received signal.

Accordingly, it is an object of this invention to provide an improved differential amplifier capable of decreasing the number of terminals for external connection and decreasing the noise entering into it and is suitable to be incorporated into an integrated circuit.

According to this invention there is provided a differential amplifier of the type comprising a plurality of differential amplifier units which are cascade connected into first to last stages, each differential amplifier unit including first and second amplifier elements each having a control electrode and first and second electrodes, the first electrodes of respective amplifier elements being coupled to a first source and the second electrodes of respective amplifier units being commonly connected to a second source through respective constant current elements, the first stage being supplied with an input signal and the last stage giving forth an amplified output, wherein the differential amplifier is constructed by arranging double end differential amplifier units at odd numbered stages except the last stage, single end differential amplifier units at even numbered stages except the last stage, connecting a control electrode of at least one amplifier element of a succeeding stage to an output of a preceding stage except the last stage, and connecting a control electrode of at least one amplifier element of the last stage to an output of the preceding stage; and the differential amplifier further comprises means for supplying the control electrode of the first amplifier element of the first stage with an input signal through an input terminal, for grounding in the sense of alternating current the control electrode of the second amplifier element through a grounding terminal, the input terminal and grounding terminal being connected through an impedance; and means for feeding back an output of the last stage to the control electrodes of the second amplifier element of odd numbered stages.

This invention can be more fully understood from the following detailed description when taken in conjunction with the accompanying drawings, in which:

FIGS. 5 and 6 are connection diagrams showing another examples of this invention respectively comprising differential amplifier units of an odd number.

Figure 3:
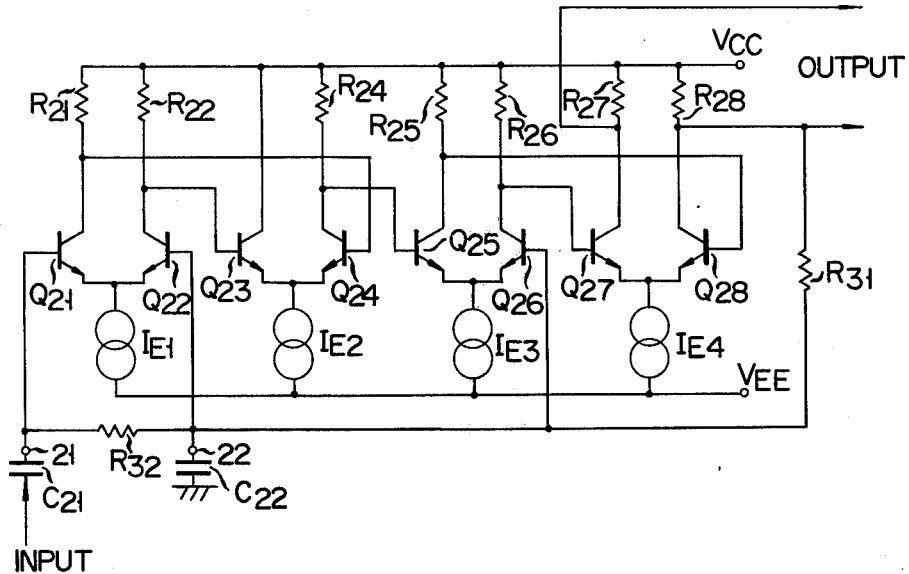
FIGS. 3 and 4 are connection diagrams showing two examples of the differential amplifier of this invention respectively comprising differential amplifier units of an even number.

The embodiment shown in FIG. 3 comprises four stages of differential amplifier units respectively including transistor pairs $Q_{21}$, $Q_{22}$; $Q_{23}$, $Q_{24}$; $Q_{25}$, $Q_{26}$ and $Q_{27}$, $Q_{28}$. Each of the first, third and fourth stage units has two outputs or is of double end type, whereas the second unit has one output or is of single end type. The collector electrodes of transistors $Q_{21}$, $Q_{22}$, $Q_{24}$, $Q_{25}$, $Q_{26}$, $Q_{27}$ and $Q_{28}$ are connected to a source line of first source $V_{CC}$ respectively through resistor $R_{21}$, $R_{22}$, $R_{24}$, $R_{25}$, $R_{26}$, $R_{27}$ and $R_{28}$ while the collector electrode of transistor $Q_{23}$ is directly connected to a source line of first source $V_{CC}$. The emitter electrodes of respective transistor pairs are commonly connected to the source line of second source $V_{EE}$ respectively through constant current elements $I_{E1}$, $I_{E2}$, $I_{E3}$ and $I_{E4}$. The base electrode of transistor $Q_{21}$ is impressed with an input signal through an external terminal 21 and a capacitor $C_{21}$ whereas the base electrode of transistor $Q_{22}$ is grounded (in the sense of alternating current) through an external terminal 22 and a bypass capacitor $C_{22}$. A resistor $R_{32}$ is connected between terminals 21 and 22. The base electrode of transistor $Q_{24}$ of the second stage is supplied with the collector output of transistor $Q_{21}$ of the first stage while the base electrode of transistor $Q_{23}$ of the second stage is supplied with the collector output of transistor $Q_{22}$ of the first stage. The base electrode of transistor $Q_{25}$ of the third stage is supplied with the collector output of transistor $Q_{24}$ of the second stage. The base electrode of transistor $Q_{27}$ of the last stage is supplied with the collector output of transistor $Q_{26}$ of the third stage, whereas the base electrode of transistor $Q_{28}$ of the last stage is supplied with the collector output of transistor $Q_{25}$ of the third stage. An output is derived out from between the collector electrodes of transistors $Q_{27}$ and $Q_{28}$ of the last stage. The collector output of transistor $Q_{28}$ is fed back to the base electrodes of transistors $Q_{22}$ and $Q_{26}$ of the first and third stages via a feedback resistor $R_{31}$. Generally, such feedback is made to the second transistors of the odd numbered stages.

Figure 1:
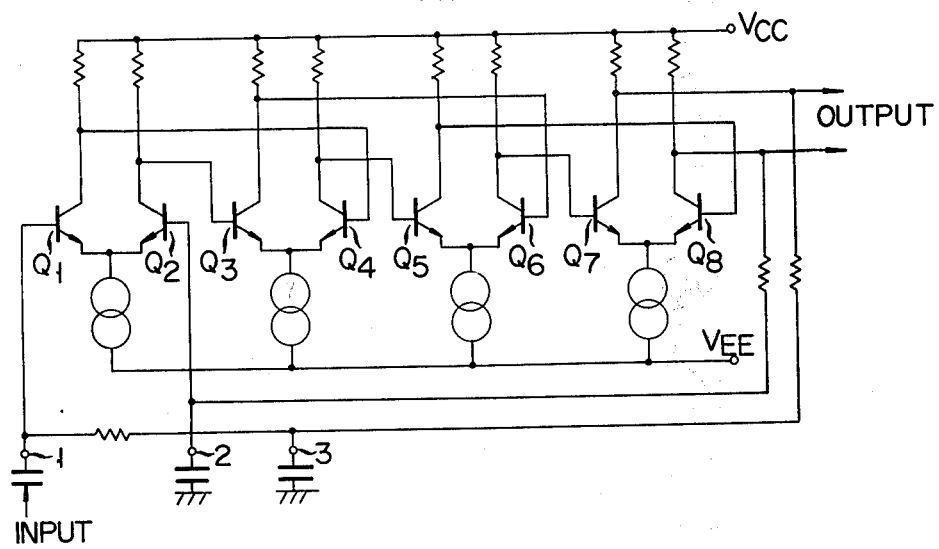
FIGS. 1 and 2 are connection diagrams showing typical examples of the prior art differential amplifier.
Figure 2:
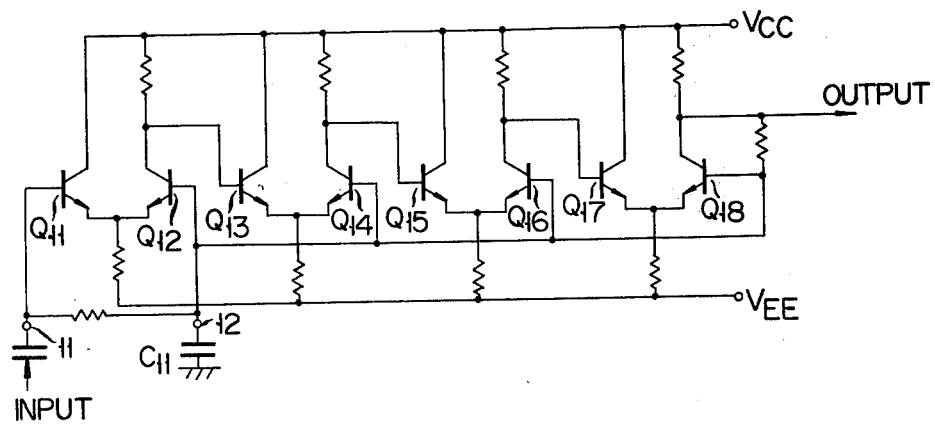

As can be clearly noted from FIG. 3, only two terminals 21 and 22 are required for external connection except the source terminals of $V_{CC}$ and $V_{EE}$. Accordingly, this differential amplifier can be advantageously fabricated as an integrated circuit. Since two transistors of the second and fourth stages are supplied with the outputs of the preceding stages it is possible to increase the voltage gain than that of the differential amplifier shown in FIG. 2. Moreover, it is possible to effectively prevent the noise on the source lines from entering into the differential amplifier. More particularly, the differential amplifier units of the first and second stages are constructed not to be affected by the noise produced in the integrated circuit. The reason for this is as follows. The base electrode of the first transistor $Q_{21}$ of the first stage is connected to the input terminal 21. Moveover, the base electrode of the second transistor $Q_{22}$ is connected to terminal 22 which is maintained at the external ground potential via capacitor $C_{22}$ so that it is possible to prevent the noise generated in the integrated circuit from entering into the differential amplifier. Even when the noise superposing on the line voltage of the source $V_{CC}$ is applied to the base electrodes of the first and second transistors $Q_{23}$ and $Q_{24}$ of the second stage through collector resistors $R_{21}$ and $R_{22}$ of the first stage, since the noise is applied to the second unit as in-phase components, the noise does not appear on the output of the second stage. Although the noise generated in the integrated circuit enters into the differential amplifier unit of the third stage, since the input signal has already been amplified with sufficiently high gain at the first and second stages, it is possible to prevent degradation of S/N ratio of the output of the last stage. This means that the differential amplifier shown in FIG. 3 has a utility value.

Let us consider the conditions for stabilization of the circuit shown in FIG. 3.

In the first stage, it is essential that two transistors $Q_{21}$ and $Q_{22}$ should have substantially the same characteristic and resistors $R_{21}$ and $R_{22}$ should have the same value whereas in the second stage it is desirable that the transistors $Q_{23}$ and $Q_{24}$ have substantially the same characteristic. When the differential amplifier is fabricated into an integrated circuit, there is no problem of greatly varying the ratio of the currents flowing through two transistors $Q_{23}$ and $Q_{24}$ of the second stage. In a standard analogue integrated circuit, it is easy to match the relative error difference in the collector currents of transistors $Q_{21}$ and $Q_{22}$ with $\pm 3\%$ since the voltage drop across the feedback resistor $R_{32}$ is substantially negligible. Where the voltage drops of collector resistors $R_{21}$ and $R_{22}$ are 200 mV, respectively, and where the relative error of the resistance values of resistors $R_{21}$ and $R_{22}$ is $\pm 3\%$ (this can be readily accomplished in ordinary integrated circuits), the difference $\Delta V_{BE}$ between the collector voltages of the transistors of the first stage is expressed as follows even under the worst condition.

$$\Delta V_{BE} = 200 (1-97^2) = 11.82 \text{ mV}$$

Consequently the ratio of the collector currents of the two transistors $Q_{23}$ and $Q_{24}$ of the second stage can by shown by $$e^{\Delta V_{BE}/V_T} e^{11.82/26} \approx 1.57$$

Thus there is no trouble, where $V_T = (KT)/q$. In this equation K represent the Boltzmann's constant, q the charge of an electron and T the absolute temperature.

Since the output of the fourth stage is applied to the base electrode of the second transistor $Q_{26}$ of the third stage as a negative DC feedback voltage, a slight difference in the collector currents of transistors $Q_{25}$ and $Q_{26}$ of the third stage can be automatically compensated for by the feedback action. To minimize the unbalance between collector currents of respective stages, it is necessary to preset the values of $I_{E2}$, $R_{24}$, $I_{E4}$ and $R_{28}$ such that they can satisfy an equation.

$$I'_{E2} \cdot R_{24} = I'_{E4} \cdot R_{28}$$

Where $I'_{E2}$ and $I'_{E4}$ represent the currents flowing through the constant current elements $I_{E2}$ and $I_{E4}$ respectively. Of course, in each amplifier stage having two outputs, it is necessary to make equal as far as possible the values of two collector resistors and to make equal the base-emitter voltages $V_{BE}$ and the current amplification constant of $\beta$ of two transistors.

Figure 4:
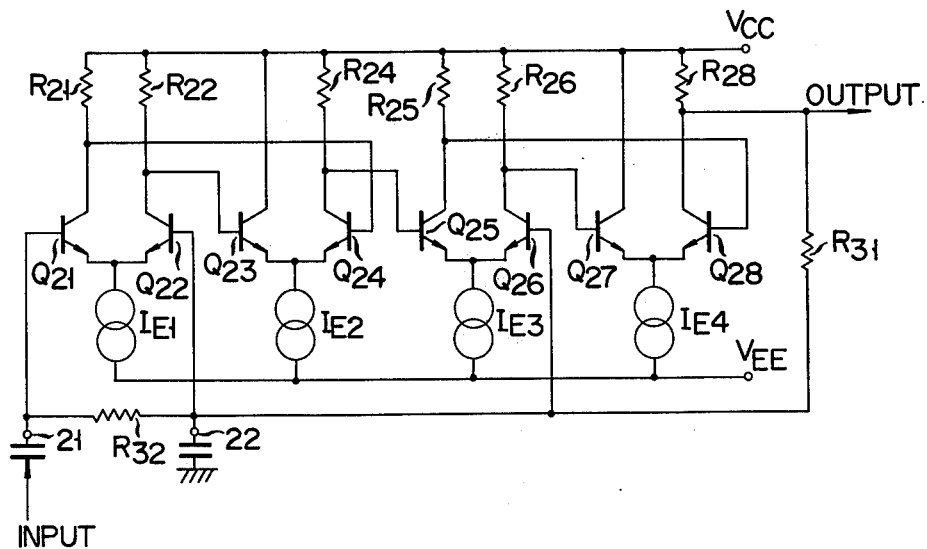

The differential amplifier shown in FIG. 3 has a four stage construction in which the last stage has two outputs. However, depending upon the purposes of utilization of the output of the last stage the stage may have one output as shown in FIG. 4.

In a modification shown in FIG. 5 five differential amplifier units are connected in cascade and the fifth unit has two outputs. In this case the output of the second transistor $Q_{30}$ of the last stage is fed back to the base electrodes of the transistors $Q_{22}$, $Q_{26}$ and $Q_{30}$ of the odd numbered stages, that is, first, third and fifth stages through a feedback resistor $R_{31}$. Since the feature of construction, function and advantage of this embodiment are similar to those of the embodiment shown in FIG. 3, corresponding elements are designated by the same reference charactors and the description thereof are not made.

In still another embodiment shown in FIG. 6, although five differential amplifier units are connected in cascade like the embodiment shown in FIG. 5, this embodiment is different from that shown in FIG. 5 in that the last stage has only one output. Again the output of the second transistor $Q_{30}$ of the last stage is fed back to the base electrodes of the second transistors and $Q_{22}$, $Q_{26}$ and $Q_{30}$ of the first, third and fifth stages.

It will be clear that the number of differential amplifier units is not limited to those of the embodiments described above and that the conductivity type of transistors is not limited to the NPN type. It is also clear that P channel or N channel type field effect transistors can also be used.

What is claimed is:

1. A differential amplifier comprising:
   an input terminal, an output terminal and a grounding terminal, said input and grounding terminals being connected through an impedance;
   at least three differential amplifier units cascade connected into a plurality of consecutively numbered stages and a last stage, said consecutively numbered stages divided into a group of odd-numbered stages and a group of even-numbered stages, each different amplifier unit including first and second amplifier elements each having a control electrode and first and second electrodes;
   a first voltage source, said first electrodes of said amplifier elements being coupled to said first source;
   a second voltage source;
   a plurality of constant current elements, one of said constant current elements connecting said second electrodes of each of said amplifier units to said second source, respectively;
   means for supplying the control electrode of the first amplifier element in the first stage with an input signal from said input terminal;
   means for grounding in the sense of alternating current the control electrode of the second amplifier element of said first stage through said grounding terminal;
   means for transferring an amplified output signal from said last stage to said output terminal;
   said odd numbered stages having double end differential amplifier units;
   said even numbered stages having single end differential amplifer units;
   said last stage having at least one of a single end differential amplifier unit and a double end differential amplifier unit;
   means for connecting a control electrode of at least one amplifier element of a succeeding numbered stage to an output of a preceding numbered stage;
   means for connecting a control electrode of at least one amplifier element of said last stage to an output of the preceding stage; and
   means for feeding back an output of said last stage to the control electrodes of the second amplifier element of said odd numbered stages.

2. The differential amplifier according to claim 1 wherein:
   the control electrodes of the second amplifier elements of single end amplifier units of numbered stages are supplied with output from first amplifier elements of preceding double end amplifier units of numbered stages;
   control electrodes of first amplifier elements of said single end amplifier units of numbered stages are supplied with output from second amplifier elements of preceding double end amplifier units of numbered stages;
   control electrodes of first amplifier element of double end amplifier units of numbered stages are supplied with output from second amplifier element of preceding single end amplifier units of numbered stages; and
   an output of said last stage is fed back to control electrodes of second amplifier element of said double end amplifier units.

3. The differential amplifier according to claim 2 wherein the total number of said differential amplifier units has an even number; the last stage is a double end amplifier unit; the control electrode of the first amplifier element of said last stage is supplied with the output of the second amplifier element of the preceding stage; and the control electrode of the second amplifier element of said last stage is supplied with the output of the first amplifier element of the preceding stage.

4. The differential amplifier according to claim 2 wherein the total number of said differential amplifier units has an even number; the last stage is a single end amplifier unit; the control electrode of the first amplifier element of said last stage is supplied with the output of the second amplifier element of the preceding stage; the control electrode of the second amplifier element of said last stage is supplied with the output of the first amplifier element of the preceding stage.

5. The differential amplifier according to claim 2 wherein the total number of said differential amplifier units has an odd number; the last stage is a double end amplifier unit; the control electrode of the first amplifier element of said last stage is supplied with the output of the second amplifier element of the preceding stage; and the control electrode of the second amplifier element of said last stage is supplied with an output of said last stage as an feed back signal.

6. The differential amplifier according to claim 2 wherein the total number of said differential amplifier units is an odd number; the last stage has a single end amplifier unit; the control electrode of the first amplifier element of said last stage is supplied with the output of the second amplifier element of the preceding stage; and the control electrode of the second amplifier element of said last stage is supplied with the output of said last stage as a feed back signal.

* * * * *